(12) United States Patent
Joshi et al.

(10) Patent No.: US 7,278,468 B2
(45) Date of Patent: Oct. 9, 2007

(54) HEAT SINK WITH MULTIPLE COOLANT INLETS

(75) Inventors: Shrikant Mukund Joshi, Williamsville, NY (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 206 days.

(21) Appl. No.: 11/242,738

(22) Filed: Oct. 4, 2005

(65) Prior Publication Data

US 2007/0074849 A1    Apr. 5, 2007

(51) Int. Cl.
*H05K 7/20* (2006.01)

(52) U.S. Cl. ............. 165/80.4; 165/139; 165/908; 257/714; 361/699

(58) Field of Classification Search ........... 165/80.4, 165/139, 908; 257/714; 361/699
See application file for complete search history.

(56) References Cited

U.S. PATENT DOCUMENTS

| | | | | |
|---|---|---|---|---|
| 4,450,896 A | * | 5/1984 | Opitz et al. ............. | 165/139 |
| 5,576,932 A | * | 11/1996 | Bishop et al. ............. | 165/908 |
| 5,604,665 A | * | 2/1997 | Chrysler et al. ............ | 165/908 |
| 5,640,046 A | * | 6/1997 | Suzuki et al. ............. | 257/714 |
| 6,015,008 A | * | 1/2000 | Kogure et al. ............. | 165/185 |
| 6,134,108 A | * | 10/2000 | Patel et al. ............... | 165/908 |
| 6,781,834 B2 | * | 8/2004 | Nair et al. ............... | 165/908 |
| 6,796,370 B1 | * | 9/2004 | Doll ......................... | 165/80.4 |
| 2006/0185829 A1 | * | 8/2006 | Duan et al. ............. | 165/104.33 |
| 2007/0039720 A1 | * | 2/2007 | Ghosh et al. ............. | 361/699 |

* cited by examiner

*Primary Examiner*—Leonard R Leo
(74) *Attorney, Agent, or Firm*—Patrick M. Griffin

(57) ABSTRACT

The subject invention provides a heat sink for cooling electronic devices. The heat sink includes an upper chamber and a lower chamber separated by a baffle therebetween. The lower chamber includes a base having a central axis and a plurality of curvilinear fins disposed radially about the central axis of the base. The upper chamber includes a lid defining an inlet and an inlet tube interconnecting the upper chamber and the lower chamber for directing a fluid through the upper chamber and impinging the fluid on the base in the lower chamber. A sidewall extends between the base and the lid and is disposed about the fins. The sidewall includes a peripheral inlet for directing the fluid perpendicular to the central axis and at the fins.

13 Claims, 3 Drawing Sheets

HEAT SINK WITH MULTIPLE COOLANT INLETS

BACKGROUND OF THE INVENTION

1. Field of the Invention

The subject invention provides a heat sink assembly for removing heat from an electronic device such as a microprocessor or a computer chip

2. Description of the Prior Art

These electronic devices generate a high concentration of heat, typically a power density in the range of 5 to 35 W/cm². Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm². However, the increased computing speeds have resulted in a corresponding increase in the power density of the electronic devices in the order of 20 to 35 W/cm², thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm².

The amount of heat transferred between the heat sink and the cooling fluid is dependent upon a heat transfer coefficient therebetween. The heat transfer coefficient is dependent upon a temperature gradient between the heat sink and the cooing fluid, with the higher heat transfer coefficient corresponding to higher temperature gradients, i.e., the higher the temperature gradient between the heat sink and the cooling fluid, the more heat the cooling fluid will remove. The amount of heat stored in the heat sink varies according to the distance from the heat source, with the highest concentration of heat occurring directly above the heat source in the base plate.

SUMMARY OF THE INVENTION AND ADVANTAGES

The subject invention provides a heat sink assembly for removing heat from an electronic device. The assembly includes a base having a top surface and a central axis perpendicular thereto. A plurality of fins extend upwardly from the top surface of the base a distance to a top edge and are disposed radially about the central axis. A lid having a bottom surface is in spaced relationship with the top edge of the plurality of fins and is parallel to the top surface of the base. A sidewall extends between the top surface of the base and the bottom surface of the lid and is disposed about the plurality of fins. An axial inlet is disposed in the lid for directing a fluid parallel to the central axis and onto the top surface of the base. An outlet is disposed in the sidewall between the top edge of the plurality of fins and the bottom surface of the lid for discharging the fluid. A peripheral inlet is disposed in the sidewall between the top edge of the plurality of fins and the top surface of the base for directing the fluid perpendicular to the central axis and at the plurality of fins.

Accordingly, the peripheral inlet directs the fluid at the plurality of fins, thus creating a circular flow circulating between the plurality of fins and the sidewall of the heat sink. This circular flow of fluid from the peripheral inlet mixes with the fluid directed at the base from the axial inlet, which is directed radially outward by the plurality of fins, thereby minimizing the temperature increase in the fluid and maximizing the heat transfer capacity of the heat sink assembly.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a heat sink assembly is shown generally at 20 in the Figures.

Figure 1:
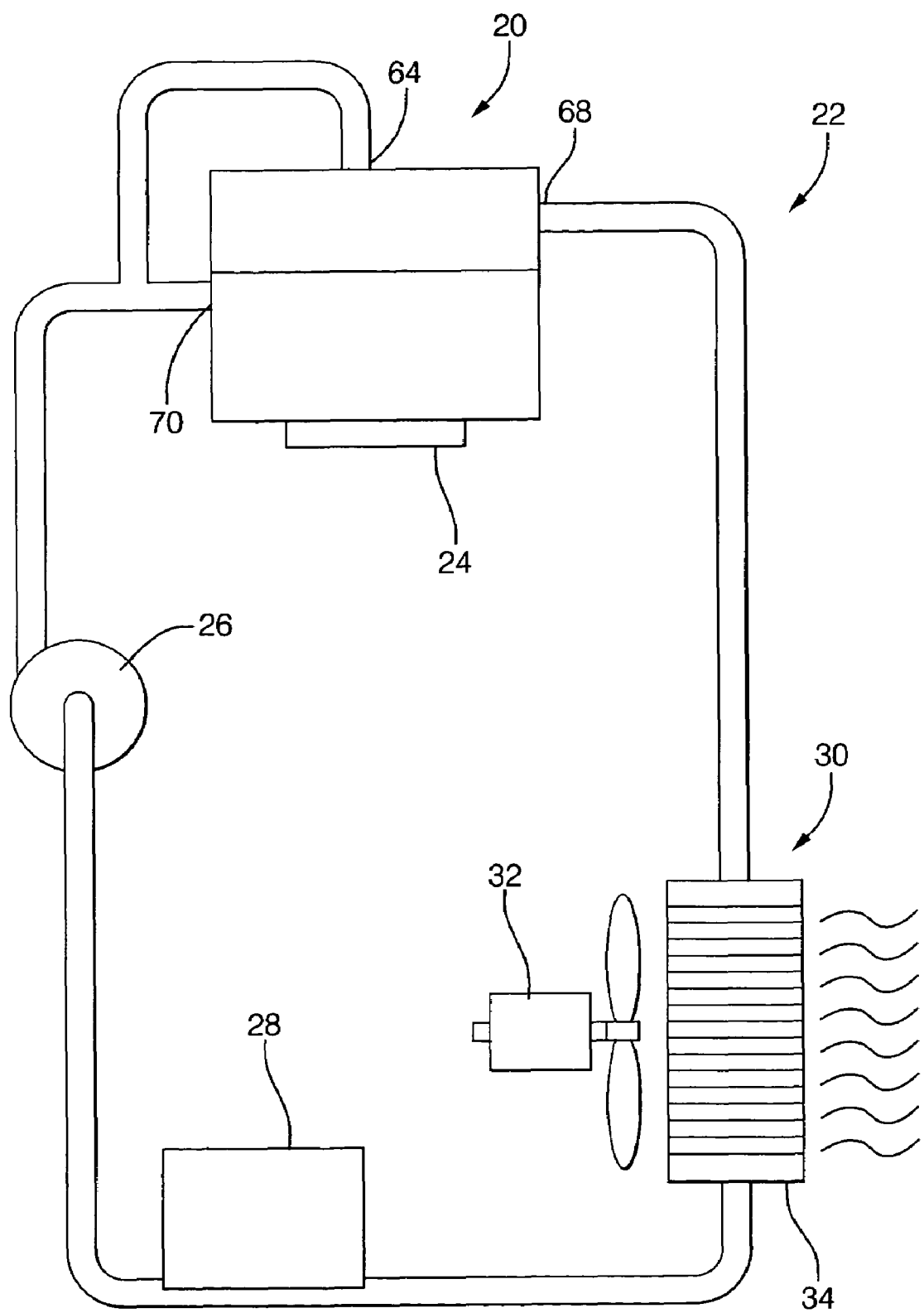
FIG. 1 is a schematic view of a liquid cooling system.

Referring to FIG. 1, the operation of the heat sink 20 is incorporated into a liquid cooling system, generally shown at 22, and is for cooling an electronic device 24. A working fluid mover, such as a pump 26, moves a flow of cooling fluid, usually a liquid, through a fluid storage tank 28, which stores excess fluid. The pump 26 moves the fluid through a heat exchanger, generally shown at 30, to dissipate heat from the fluid. The heat exchanger 30 includes a fan 32 and a radiator 34. The radiator 34 can be of the well known type including tubes with cooling fins between the tubes to exchange heat between the fluid passing through the tubes and air forced through the radiator 34 by the fan 32.

Figure 2:
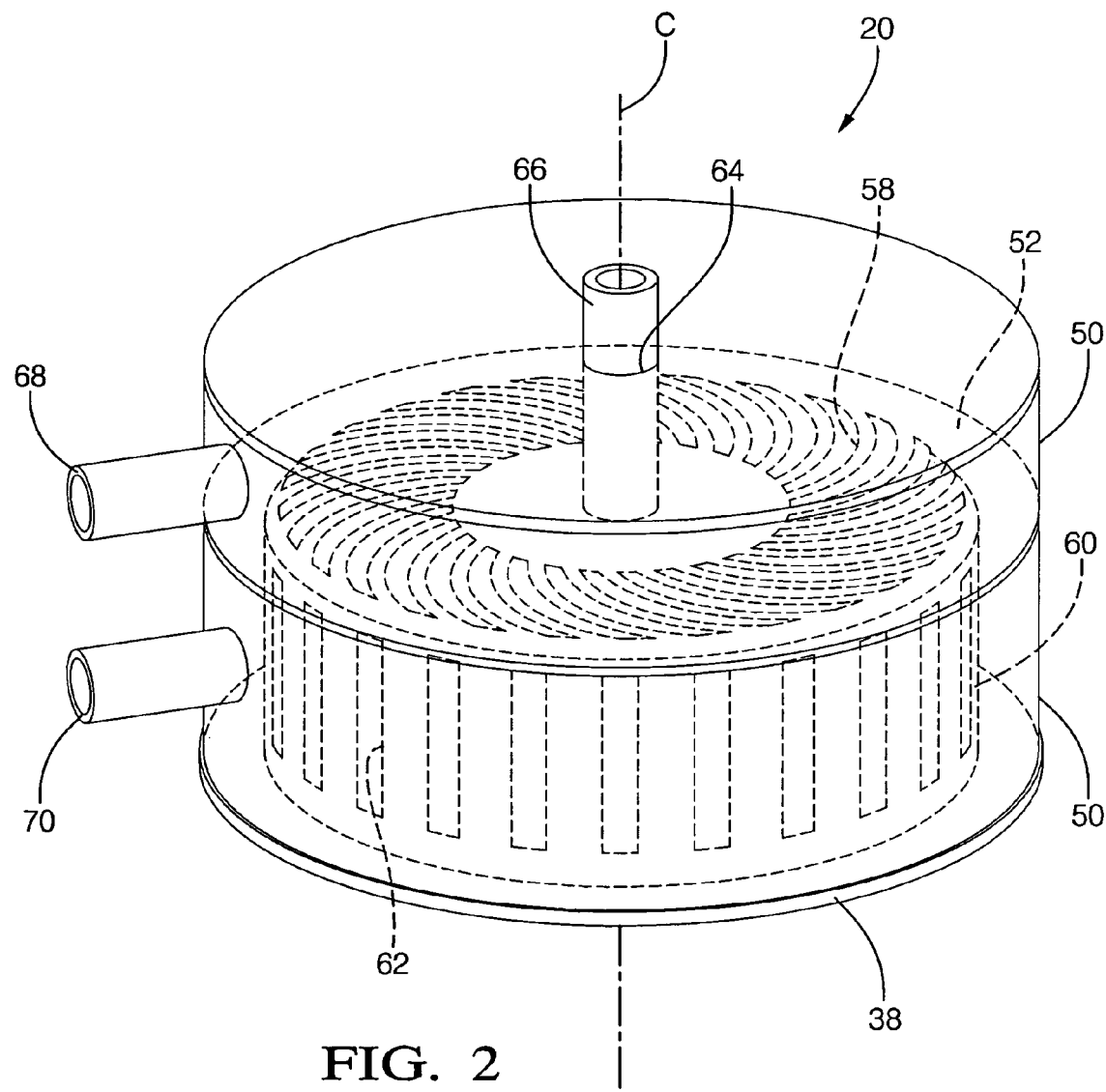
FIG. 2 is a perspective view of a heat sink assembly.
Figure 3:
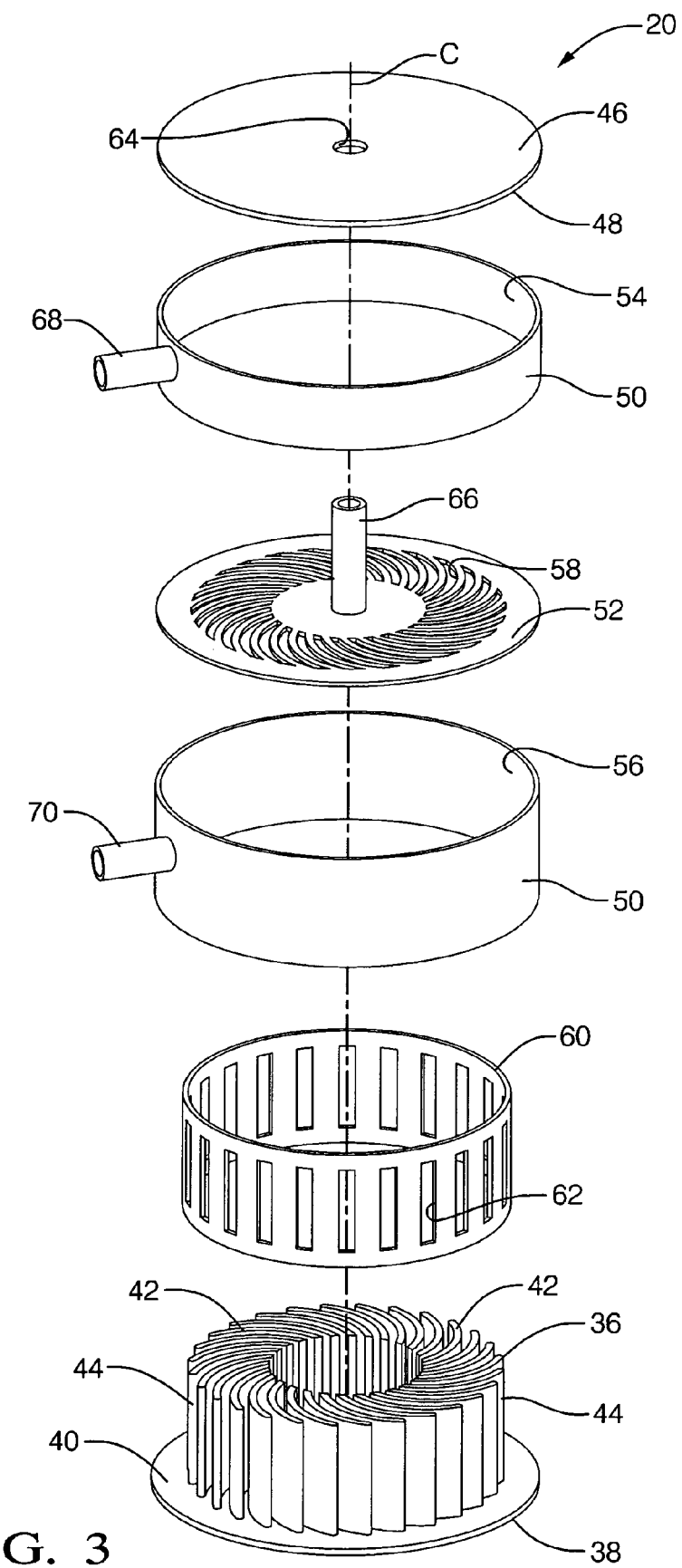
FIG. 3 is an exploded perspective view of the heat sink assembly.

Referring to FIGS. 2 and 3, the heat sink 20 includes a base 38 having a top surface 40 and a central axis C perpendicular thereto. The base 38 is circular in shape with the central axis C disposed at the center of the base 38. The base 38 includes a contact surface, which is for contacting the electronic device 24 and absorbing heat produced thereby.

A plurality of fins 36 extend upwardly from the top surface 40 of the base 38 a distance to a top edge 42 and are disposed radially about the central axis C. The plurality of fins 36 include a curvilinear shape, and are spaced from the center of the base 38 and the central axis C a distance. The plurality of fins 36 are identical in configuration and extend radially outward along a curved path to an outer periphery 44 of the plurality of fins 36. The outer periphery 44 of the plurality of fins 36 includes a circular shape, concentric with base 38.

A lid 46 having a bottom surface 48 is in spaced relationship with the top edge 42 of the plurality of fins 36 and is parallel to the top surface 40 of the base 38. The lid 46 includes a circular shape and is identical in size and concentric with the base 38. A sidewall 50 extends between the top surface 40 of the base 38 and the bottom surface 48 of the lid 46 and is disposed about the outer periphery 44 of the plurality of fins 36. The sidewall 50 is in spaced relationship with the outer periphery 44 of the plurality of fins 36 so that the fluid may circulate between the outer periphery 44 of the fins 36 and the sidewall 50.

A baffle 52 is disposed between the top edge 42 of the plurality of fins 36 and the lid 46. The baffle 52 defines an upper chamber 54 above the plurality of fins 36 and a lower chamber 56 enclosing the plurality of fins 36. The baffle 52 includes a plurality of ports 58 interconnecting the upper chamber 54 and the lower chamber 56 for allowing the fluid to pass from the lower chamber 56 to the upper chamber 54. Preferably, the plurality of ports 58 include a curvilinear shape corresponding to the plurality of fins 36, and positioned between adjacent fins 36 such that fluid flowing between any two of the plurality of fins 36 may flow directly upward through the curvilinear port 58 and into the upper chamber 54.

A slotted wall 60 is disposed between the sidewall 50 and the outer periphery 44 of the plurality of fins 36 and extends between the base 38 and the baffle 52. The slotted wall 60 includes a plurality of slots 62 for directing the fluid between adjacent pairs of the plurality of fins 36. The slotted wall 60 includes a circular shape that is concentric with the outer periphery 44 of the fins 36 and the base 38.

An axial inlet 64 is disposed in the lid 46 for directing the fluid parallel to the central axis C and onto the top surface 40 of the base 38. The inlet is aligned with the central axis C and concentric with the base 38 and the lid 46. The baffle 52 includes an inlet tube 66 extending between the baffle 52 and the bottom surface 48 of the lid 46 for interconnecting the inlet and the lower chamber 56 of the heat sink 20. The inlet tube 66 directs the fluid entering the inlet to the lower chamber 56 and onto the top surface 40 of the base 38.

An outlet 68 is disposed in the sidewall 50 adjacent the upper chamber 54 of the heat sink 20 between the top edge 42 of the plurality of fins 36 and the bottom surface 48 of the lid 46 for discharging the fluid. The fluid flows from the lower chamber 56, through the ports 58 in the baffle 52 and into the upper chamber 54 where the fluid exits the heat sink 20 through the outlet 68. The heat exchanger 30 receives the fluid from the outlet 68 and removes heat from the fluid.

A peripheral inlet 70 is disposed in the sidewall 50 adjacent the lower chamber 56 of the heat sink 20 between the top edge 42 of the plurality of fins 36 and the top surface 40 of the base 38. The peripheral inlet 70 directs the fluid perpendicular to the central axis C and at the slotted wall 60 and the plurality of fins 36. The circular shape of the slotted wall 60 helps direct the fluid around the slotted wall 60 and the outer periphery 44 of the fins 36 between the slotted wall 60 and the sidewall 50.

The base 38, the plurality of fins 36, and the slotted wall 60 are constructed of a thermally conductive material, such as aluminum. However, any thermally conductive material suitable for absorbing and transferring heat may be utilized. Accordingly, the scope of the invention should not be limited to the type of material utilized for the base 38, the plurality of fins 36, or the slotted wall 60.

During operation, the pump 26 circulates the cooling fluid to the two fluid inlets of the heat sink 20, the axial inlet 64 and the peripheral inlet 70. The inlet tube 66 directs the fluid from the axial inlet 64 through the upper chamber 54 and into the lower chamber 56, where the fluid is impinged upon the top surface 40 of the base 38. The fluid from the axial inlet 64 flows radially outward between the plurality of fins 36. The peripheral inlet 70 directs the fluid perpendicular to the slotted wall 60 and the plurality of fins 36. The slotted wall 60 directs the fluid around the outer periphery 44 of the fins 36; through the slots 62 and between adjacent pairs of the fins 36. The fluid from the axial inlet 64 and the peripheral inlet 70 meet as opposing fluid streams between adjacent pairs of the fins 36, resulting in an upwelling of the fluid through the ports 58 of the baffle 52 and into the upper chamber 54 of the heat sink 20. The fluid then exits the heat sink 20 through the outlet 68. The pump 26 moves the fluid through the heat exchanger 30, which removes the heat stored within the fluid and then re-circulates the fluid back to the axial inlet 64 and the peripheral inlet 70.

As the fluid from the axial inlet 64 flows radially outward, the fluid absorbs heat from the base 38 and the plurality of fins 36. Similarly, as the fluid from the peripheral inlet 70 flows around the outer periphery 44 of the fins 36, through the slotted wall 60 and between adjacent pairs of fins 36, the fluid absorbs heat from the base 38, the slotted wall 60, and the plurality of fins 36. As the temperature of the fluid increases, the heat transfer capacity of the fluid decreases due to a decrease in the temperature differential between the fluid and the heat sink 20. However, because the fluid is introduced from both the axial inlet 64 and the peripheral inlet 70, the decrease in the temperature differential between the fluid and the heat sink 20 is minimized, therefore maximizing the efficiency of the liquid cooling system 22.

The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A heat sink assembly for removing heat from an electronic device, said assembly comprising;

a base having a top surface and a central axis perpendicular thereto, a plurality of fins extending upwardly from said top surface of said base a distance to a top edge and disposed radially about said central axis, a lid having a bottom surface in spaced relationship with said top edge of said plurality of fins and parallel to said top surface of said base, an upper and lower sidewall extending between said top surface of said base and said bottom surface of said lid and disposed about said plurality of fins, an axial inlet disposed in said lid for directing a fluid parallel to said central axis and onto said top surface of said base, an outlet disposed in said upper sidewall between said top edge of said plurality of fins and said bottom surface of said lid for discharging the fluid, and a peripheral inlet disposed in said lower sidewall between said top edge of said plurality of fins and said top surface of said base for directing the fluid perpendicular to said central axis and at said plurality of fins.

2. An assembly as set forth in claim 1 wherein said plurality of fins define an outer periphery and said lower sidewall is in spaced relationship about said outer periphery for circulating the fluid between said outer periphery of said plurality of fins and said lower sidewall.

3. An assembly as set forth in claim 2 wherein said assembly includes a baffle disposed between said top edge of said plurality of fins and said lid for defining an upper chamber above said plurality of fins and a lower chamber enclosing said plurality of fins.

4. An assembly as set forth in claim 3 wherein said assembly includes a slotted wall extending between said base and said baffle and having a plurality of slots aligned between adjacent pairs of said plurality of fins for directing the fluid between said plurality of fins.

5. An assembly as set forth in claim 4 wherein said baffle defines a plurality of ports interconnecting said upper chamber and said lower chamber.

6. An assembly as set forth in claim 5 wherein said plurality of fins include a curvilinear shape.

7. An assembly as set forth in claim 6 wherein said plurality of ports include a curvilinear shape corresponding to said plurality of fins.

8. An assembly as set forth in claim 5 wherein said baffle includes an inlet tube extending between said baffle and said bottom surface of said lid for directing the fluid entering said inlet to said lower chamber.

9. An assembly as set forth in claim 8 wherein said base and said plurality of fins include a thermally conductive material.

10. An assembly as set forth in claim 9 wherein said assembly includes a pump for circulating the flow of cooling fluid to said inlets.

11. An assembly as set forth in claim 10 wherein said assembly includes a heat exchanger for removing heat from the flow of cooling fluid exiting said outlet.

12. An assembly as set forth in claim 1 wherein said assembly includes a tank for storing the cooling fluid.

13. An assembly as set forth in claim 12 wherein said base and said lid and said outer periphery of said plurality of fins include a concentric circular shape.

* * * * *